United States Patent [19]
Kurosaki

[11] Patent Number: 5,196,990
[45] Date of Patent: Mar. 23, 1993

[54] METAL PRINTED CIRCUIT BOARD

[75] Inventor: Toshio Kurosaki, Kanagawa, Japan

[73] Assignee: Fuji Electric Co., Ltd., Kanagawa, Japan

[21] Appl. No.: 857,125

[22] Filed: Mar. 25, 1992

Related U.S. Application Data

[63] Continuation of Ser. No. 661,210, Feb. 27, 1991, abandoned.

[30] Foreign Application Priority Data

Mar. 1, 1990 [JP] Japan .................................. 2-49812

[51] Int. Cl.$^5$ .............................................. H05K 7/20
[52] U.S. Cl. ..................................... 361/386; 361/389; 361/397
[58] Field of Search ................... 361/387–389, 361/397, 400, 424, 311–313, 315, 306 DC; 357/81

[56] References Cited

U.S. PATENT DOCUMENTS 4,374,457  2/1983  Wiech, Jr. ............................ 361/382
4,931,905  6/1990  Cirrito et al. ........................ 361/382

Primary Examiner—Gregory D. Thompson
Attorney, Agent, or Firm—Finnegan, Henderson, Farabow, Garrett and Dunner

[57] ABSTRACT

A metal printed board having circuit conductors on the surface of an insulating plate layered on a metal plate, wherein grooves formed in the portions of the metal plate which face the circuit conductor. The electronic parts mounted conducts into the metal plate through the solder portions and the insulating plate just thereunder. Accordingly, the presence of the grooves little impairs the thermal conduction. The stray capacitance between the conductor circuit and the metal plate because of the formed grooves, is considerably reduced, so that the signal leakage and noise sneaking are minimized.

4 Claims, 1 Drawing Sheet

METAL PRINTED CIRCUIT BOARD

This application is a continuation of application Ser. No. 07/661,210 filed Feb. 27, 1991, now abandoned.

BACKGROUND OF THE INVENTION

The present invention relates to a metal printed circuit board used for a power converting device, such as an inverter.

The metal printed circuit board is superior to an ordinary glass epoxy resin printed circuit board in that heat generated from circuit parts mounted on the board can readily be radiated. However, the former is inferior to the latter in that signal and noise leakage are apt to occur because of a relatively large stray capacitance between the metal sheet and the conductor circuit.

FIG. 3 is a sectional view showing a general structure of a conventional metal printed circuit board. In the FIGURE, reference numeral 1 designates a metal plate and numeral 2 an insulating plate. Usually, the insulating plate 2 is attached to the metal plate 1. A circuit conductor 3 is formed on the insulating plate 2. Electronic parts 4 are mounted on the circuit conductor by means of solder 5, for example. A stray capacitance 6 formed between the insulating plate 2 and the metal plate 1 is symbolically illustrated.

Most of heat generated from the electronic parts 4 is radiated in the direction of arrows 8. The thermal conduction varies inversely with the thickness t1 of the insulating plate 2. Generally, the thickness t1 of the insulating sheet 2 is chosen to be as thin as possible, without sacrificing the ability of the sheet to withstand the voltage applied between the conductor circuit 3 and the metal plate 1.

Signal leakage possible occurs between the conductor circuits, through stray capacitance. External noise possible leaks into the circuits through the metal plate 1. One of the measures taken to solve the problems of the signal and noise leakage has been to increase the thickness t1 of the insulating plate 2. This solution however, results in loss of thermal conduction and in satisfactory heat radiation.

The problem to be solved by the invention is reduction in stray capacitance between the circuit conductor and the metal sheet on the metal printed circuit board while maintaining good heat radiation.

SUMMARY OF THE INVENTION

The invention solves the problem by a metal printed circuit board in which a circuit conductor is formed on the surface of an insulating plate layered on a metal plate, wherein grooves are formed in the portions of the metal plate which face the conductor circuit.

According to the metal printed circuit board of the present invention, most of heat generated by the electronic parts is conducted into the metal plate through soldered portions and the insulating plate portions located thereunder. Accordingly, the presence of the grooves little impairs the thermal conduction. Because of the grooves the stray capacitance between the conductor circuit and the metal plate, is considerably reduced, so that the signal and noise leakage are minimized.

DESCRIPTION OF THE PREFERRED EMBODIMENT

Figure 1:
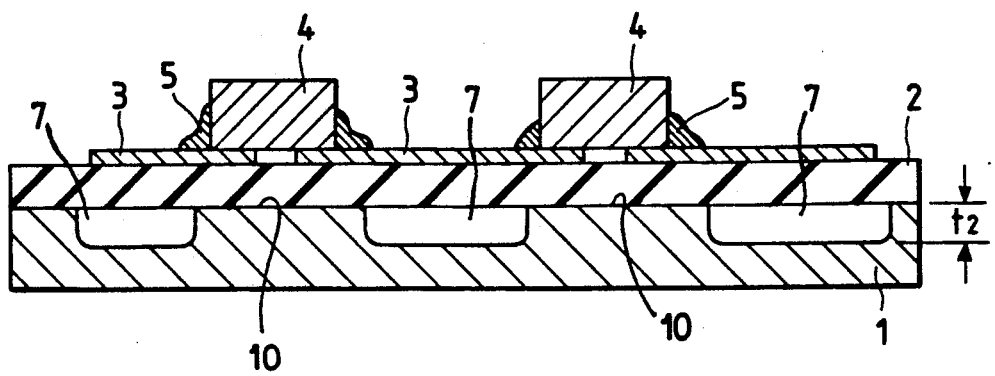
FIG. 1 is a sectional view showing a metal printed circuit board according to the invention.
Figure 2:
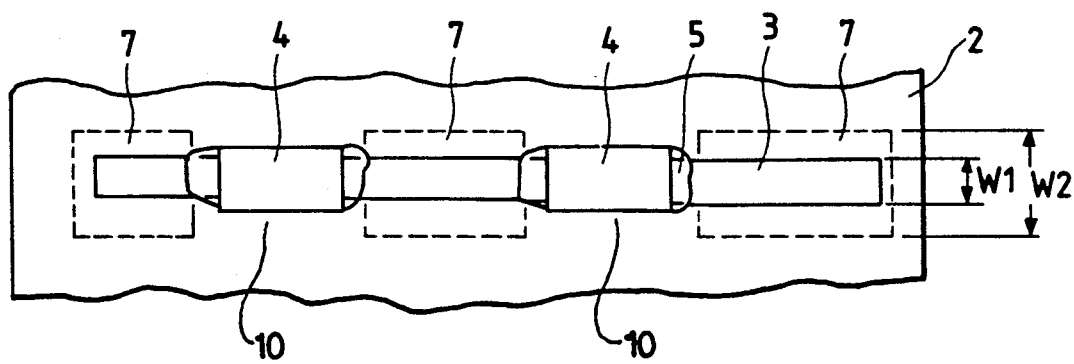
FIG. 2 is a partial plan view showing the metal printed circuit board of FIG. 1.
Figure 3:
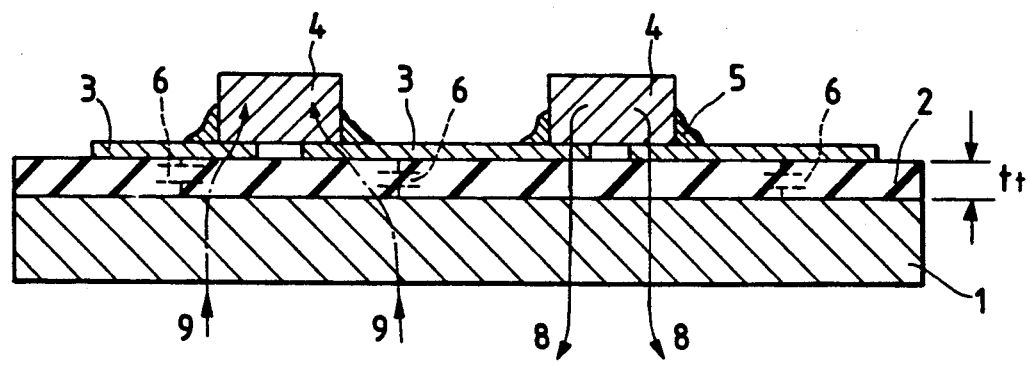
FIG. 3 is a sectional view showing a conventional metal printed circuit board.

FIGS. 1 and 2 are a sectional view and a partial plan view of a metal printed circuit board according to the present invention. Usually, the insulating plate 2 is attached onto the metal plate 1. A circuit conductor 3 is bonded on the insulating board 2. Electronic parts 4 are mounted on the circuit conductor by means of solder 5, for example.

The metal printed board of the present invention is different from the conventional metal printed board in that grooves 7 are formed in the portions of the surface region of the metal plate 1, opposite from the circuit conductor 3. Each groove 7 resembles the circuit conductor in shape, and its dimensions are t2 in depth and w2 in width. The width w2 of the groove is chosen to be larger than the width w1 of the circuit conductor. The width w2, so chosen, prevents an electric field from concentrating between each corner of the groove and the conductor circuit portion, and hence eliminates the necessity of increasing the depth 52 of the groove.

With such a structure, a metal printed circuit board is provided in which the thermal conduction is good, but the stray capacitance is small. Most of heat generated by the electronic parts is conducted into the metal plate through the solder portions 5, the insulating plate 2 immediately thereunder, and via lands to under the part 4 between the grooves 7. Accordingly, the presence of the grooves 7 little impairs the thermal conduction. The stray capacitance, because of the formed grooves, is considerably reduced, so that the signal and noise leakage are minimized.

It is evident to those skilled persons in the art that the invention is applicable for the case where the metal plate 1 and the insulating plate 2 are not bonded.

As seen from the foregoing description, in the invention, the grooves are formed in the portions of the metal plate, which face to the circuit conductors. With the structure, the stray capacitance is considerably reduced without impairing the thermal conduction, so that the signal and noise leakage are effectively held back.

What is claimed is:

1. In a metal printed circuit board having circuit conductors on a surface of an insulating plate layered on a metal plate having surface portions facing said insulating plate, and electronic parts mounted on said circuit conductors, the improvement comprising grooves formed in said surface portions and underlying said circuit conductors, and lands in said metal plate between said grooves and underlying said electronic parts, said lands being in contact with said insulating plate, whereby said grooves reduce stray capacitance without impairing conduction of heat from said electronic parts to said metal plate.

2. The metal printed circuit board according to claim 1, wherein each of said grooves underlies at least a portion of at least one of said circuit conductors and has substantially the same planar shape as that of said portion of said at least one circuit conductor.

3. The metal printed circuit board according to claim 1, wherein each of said grooves underlies at least a portion of at least one of said circuit conductors and has a width larger than that of said portion of said at least one of said circuit conductors.

4. The metal printed circuit board according to claim 1, including soldered interconnections of said circuit conductors and said electronic parts, said soldered interconnections defining part of a path for heat transfer from said electronic parts to said metal plate.

* * * * *

UNITED STATES PATENT AND TRADEMARK OFFICE
CERTIFICATE OF CORRECTION

PATENT NO. : 5,196,990
DATED : March 23, 1993
INVENTOR(S) : Toshio Kurosaki

It is certified that error appears in the above-indentified patent and that said Letters Patent is hereby corrected as shown below:

On the Title Page:
Abstract, Front Page, delete in its entirety and replace with Amended Abstract:

--A metal printed board in which circuit conductors and electronic parts connected by the conductors are formed on the surface of an insulating plate layered on a metal plate and wherein grooves are formed in portions of the metal plate which face and underline the circuit conductors. Most of heat generated by the electronic parts is conducted into the metal plate through the solder portions, the insulating plate, and lands separating the grooves in the metal plate.

UNITED STATES PATENT AND TRADEMARK OFFICE
CERTIFICATE OF CORRECTION

PATENT NO. : 5,196,990
DATED : March 23, 1993
INVENTOR(S) : Toshio Kurosaki

It is certified that error appears in the above-indentified patent and that said Letters Patent is hereby corrected as shown below:

Accordingly, the presence of the grooves does not impair the thermal conduction between the electronic parts and the metal plate. Stray capacitance between the circuit conductor and the metal plate is reduced because of the formed grooves so that the signal leakage and noise are minimized.--.

Signed and Sealed this

Second Day of August, 1994

Attest:

BRUCE LEHMAN

Attesting Officer     Commissioner of Patents and Trademarks